(12) United States Patent
Weber et al.

(10) Patent No.: US 9,406,747 B2
(45) Date of Patent: Aug. 2, 2016

(54) COMPONENT IN THE FORM OF A WAFER LEVEL PACKAGE AND METHOD FOR MANUFACTURING SAME

(71) Applicant: Robert Bosch GmbH, Stuttgart (DE)

(72) Inventors: Heribert Weber, Nuertingen (DE); Hartmut Kueppers, Reutlingen (DE); Jens Frey, Filderstadt (DE); Neil Davies, Sonnenbuehl-Genkingen (DE); Jochen Reinmuth, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/307,055

(22) Filed: Jun. 17, 2014

(65) Prior Publication Data

US 2014/0374917 A1 Dec. 25, 2014

(30) Foreign Application Priority Data

Jun. 20, 2013 (DE) .......................... 10 2013 211 613

(51) Int. Cl.
*H01L 23/48* (2006.01)
*H01L 29/06* (2006.01)
*H01L 25/065* (2006.01)
*H01L 23/31* (2006.01)
*B81C 1/00* (2006.01)
*H01L 25/00* (2006.01)

(52) U.S. Cl.
CPC ........ *H01L 29/0657* (2013.01); *B81C 1/00238* (2013.01); *H01L 23/3114* (2013.01); *H01L 25/0657* (2013.01); *H01L 25/50* (2013.01); *B81C 2203/0118* (2013.01); *B81C 2203/0792* (2013.01); *H01L 2224/48091* (2013.01); *H01L 2224/48471* (2013.01); *H01L 2225/06506* (2013.01); *H01L 2225/06568* (2013.01)

(58) Field of Classification Search
CPC . H01L 25/50; H01L 25/0657; H01L 25/3114; H01L 29/0657
USPC .................................. 257/777, 784, E23.181
See application file for complete search history.

(56) References Cited

U.S. PATENT DOCUMENTS

| | | | |
|---|---|---|---|
| 8,709,868 B2* | 4/2014 | Bowles | ........................ 438/107 |
| 2005/0067688 A1* | 3/2005 | Humpston | .................... 257/704 |
| 2007/0224728 A1* | 9/2007 | Wu | ................... H01L 27/14618 438/106 |
| 2009/0008728 A1* | 1/2009 | Fujii | ....................... B81B 7/007 257/415 |
| 2011/0012269 A1* | 1/2011 | Ishihara | ............... H01L 21/568 257/774 |

\* cited by examiner

*Primary Examiner* — Nitin Parekh
(74) *Attorney, Agent, or Firm* — Norton Rose Fulbright US LLP (57) ABSTRACT

A vertically integrated hybrid component is implemented in the form of a wafer level package including: at least two element substrates assembled one above the other; a molded upper sealing layer made of an electrically insulating casting; and an external electrical contacting of the component being implemented on the top side via at least one contact stamp which is embedded in the sealing layer so that (i) its lower end is connected to a wiring level of an element substrate and (ii) its upper end is exposed in the surface of the sealing layer.

3 Claims, 9 Drawing Sheets

COMPONENT IN THE FORM OF A WAFER LEVEL PACKAGE AND METHOD FOR MANUFACTURING SAME

BACKGROUND OF THE INVENTION

1. Field of the Invention

The present invention relates to packaging of integrated circuits for vertically integrated hybrid components in the form of a wafer level package.

2. Description of the Related Art

Vertically integrated hybrid components generally include multiple different elements, which are assembled one above the other as a stack or chip stack. The different functionalities of the elements supplement one another advantageously to yield an application. Depending on the application, MEMS elements having a micromechanical functionality and also ASIC elements having a plain circuitry-wise functionality may be combined with one another in one component. ASIC elements are also frequently used for capping the micromechanical structure of a MEMS element as part of vertically integrated hybrid components. For example, there are known vertically integrated hybrid inertial sensor components including a micromechanical sensor element and an ASIC element on which the analyzer circuit for the sensor signals is integrated. In these inertial sensor components, the ASIC element is assembled over the sensor structure of the MEMS element and seals it off from environmental influences.

In the case of wafer level packages, the individual element substrates are processed largely independently of one another to implement the corresponding circuitry-wise and/or micromechanical functionality for a plurality of elements. The element substrates are then assembled in the wafer composite and are also contacted electrically. Only thereafter are the packages separated. This very extensive parallelization of chip manufacturing and packaging is extremely efficient with regard to the manufacturing process and the manufacturing costs. Furthermore, the component size may thus be minimized. Such packages require very little circuit board space and have a very small overall height. This miniaturization in both area and height has opened up a variety of possibilities for the development of novel and improved end products.

The electrical connection between the individual elements of a vertically integrated hybrid component and also its external contacting frequently take place in practice with the aid of vias. The implementation of such vias in the individual element substrates of a vertically integrated hybrid component is generally associated with complex structuring methods and coating or filling of structures with a very high aspect ratio. These processes increase the manufacturing complexity and consequently also have definite effects on the manufacturing costs.

BRIEF SUMMARY OF THE INVENTION

The present invention provides measures with which it is possible to reduce the manufacturing complexity for electrical contacting of vertically integrated hybrid components.

The structure of the wafer level package therefore includes at least two element substrates assembled one above the other and an upper sealing layer of an integrally molded, electrically insulating casting compound. The external electrical contacting of the component takes place on the top side via at least one contact stamp embedded in the sealing layer so that its lower end is connected to a wiring level of an element substrate and its upper end is exposed in the surface of the sealing layer.

The method according to the present invention for manufacturing such a component provides for the at least two element substrates to be processed independently of one another in order to implement the corresponding electrical and/or micromechanical functionality for a plurality of elements. The two element substrates are then joined together mechanically, so that at least one contact area of a wiring level of one of the two element substrates is exposed for each element. Furthermore, at least one electrical connection per component is established between the two element substrates. According to the present invention, at least one contact stamp per component is then placed on the at least one exposed contact area. An upper sealing layer of an electrically insulating casting compound in which the contact stamps are embedded is subsequently molded, so that the upper end of the contact stamps is exposed. Only then are the components separated.

Thus the concept for packaging of integrated circuits according to the present invention provides for an upper sealing layer of an electrically insulating casting compound. This sealing layer is applied to the wafer stack in a molding process on the wafer level, i.e., before separating the components, and protects all circuitry-wise and micromechanical functions on the top side of the wafer stack from external interfering influences. In contrast with the related art, where the vias are produced subsequently, the contact stamps for external contacting of the component are applied according to the present invention even before applying the upper sealing layer and are then embedded in the sealing layer. This is made possible by using an electrically insulating casting compound. Very small, highly integrated components may be manufactured in this way; these components are completely packaged already after being separated and may be installed further as part of a second-level assembly.

Fundamentally the contact stamps may be formed from any electrically conductive material, for example, a metal or a suitably doped semiconductor material. Contact stamps made of aluminum Al, copper Cu, gold Au or silver Ag have proven to be particularly suitable, not only due to their good electrical and chemical material properties but also from the standpoint of the wafer level processing. These materials are easily placed on the top side of the wafer stack with the aid of a wire bonding machine or applied by an inkjet method. In the inkjet method, a plurality of contact stamps may be created in parallel. This method is also characterized by a great flexibility with respect to the configuration and geometry of the contact stamps.

As already mentioned, the contact stamps are embedded in the upper sealing layer of the component according to the present invention except for the upper end. This may be achieved, for example, by using a mold coordinated with the height of the contact stamps. In one preferred specific embodiment of the present invention, which also takes into account certain manufacturing tolerances during creation of the contact stamps, the upper end of the contact stamps is subsequently exposed by back-thinning the upper sealing layer.

The external electrical contacting of the component according to the present invention may take place directly using the contact stamp(s) in the upper sealing layer. In this case, design parameters of the second-level assembly may also be taken into account in positioning the contact stamps. A greater design freedom in positioning the contact stamps may be achieved with the aid of a rewiring level for the contact stamps. In such a rewiring level on the upper sealing layer, terminal pads for external electrical contacting of the component may then be formed at arbitrary points.

In an advantageous refinement of the present invention, the upper sealing layer is used not only for embedding contact stamps for external electrical contacting of the component but also for embedding an electrical connection between individual element substrates of the component, i.e., for implementing an internal electrical contacting. This is implemented in the form of a wire bond connection between the active front sides of the element substrates. For this purpose, the upper element substrate is opened after assembly on the lower element substrate to expose at least one contact area on a wiring level of the lower element substrate. A wire bond connection between the contact area of the lower element substrate and a wiring level of the upper element substrate is subsequently manufactured, in which the contact stamps must be higher than the bond wires of the wire bond connection for the external electrical contacting. The wire bond connection is completely embedded in the electrically insulating casting compound, in contrast with the contact stamps during molding of the sealing layer. This type of wire bond connection for internal electrical contacting between two element substrates of a vertically integrated hybrid component is very simple to manufacture and thus also much less expensive than the implementation of vias in an element substrate.

The element concept according to the present invention also permits the integration of individual chips to supplement the component function. For this purpose, at least one individual chip is assembled on the wafer level package and then at least partially embedded in the electrically insulating casting compound during molding of the sealing layer, so that, preferably, only the chip areas which are insensitive to external interfering influences must come in contact with the ambient medium.

Although all exemplary embodiments discussed herein relate to vertically integrated hybrid components including a MEMS sensor element and an ASIC element, the present invention is not limited to this specific application but instead relates in general to vertically integrated hybrid components in the form of a wafer level package.

DETAILED DESCRIPTION OF THE INVENTION

The vertically integrated hybrid components in question here are manufactured in the form of a wafer level package of element substrates whose circuitry-wise and/or micromechanical functions supplement one another to form one application. The manufacture of such a sensor component 100 is described below.

Figure 1A:
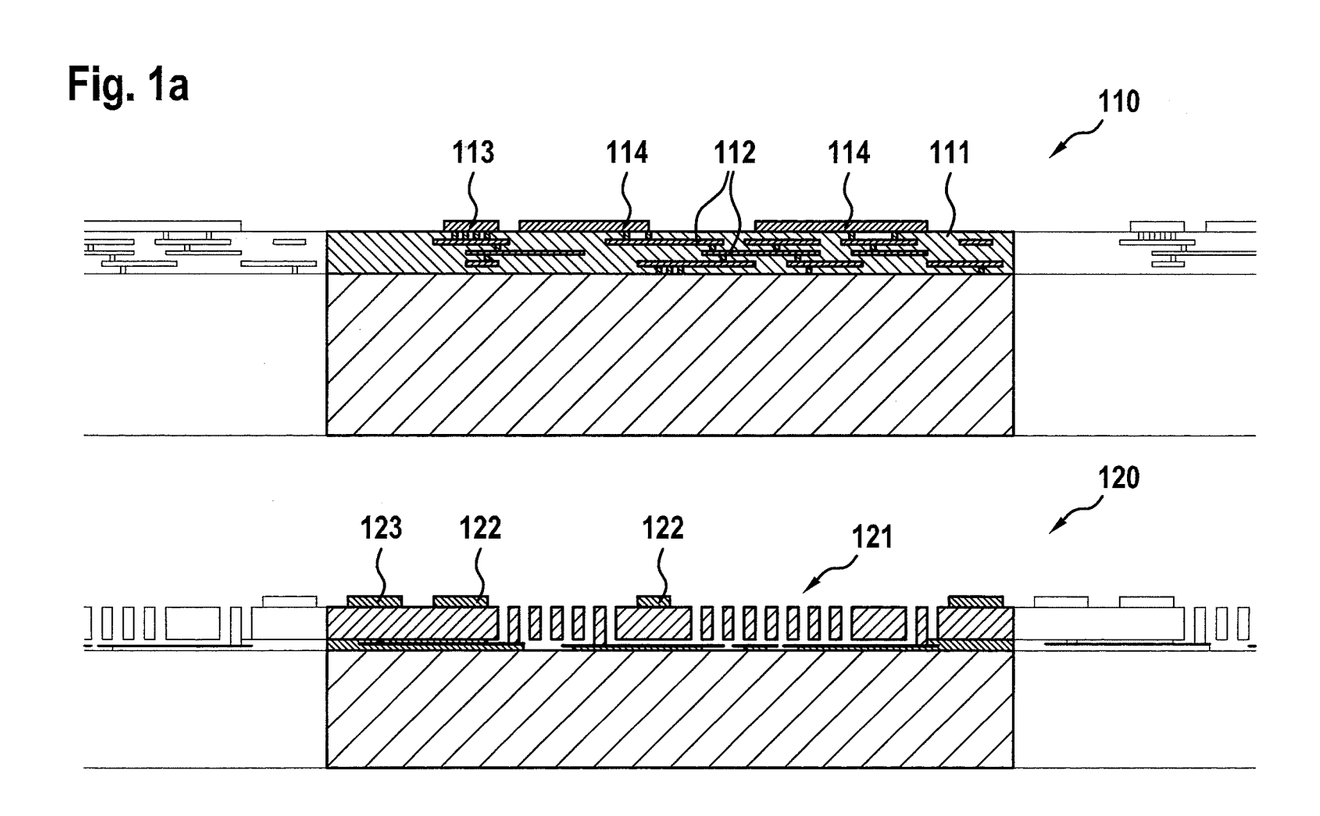
FIGS. 1a through 1f illustrate the structure of a component 100 according to the present invention in the form of a wafer level package on the basis of schematic sectional diagrams.

The starting point for this in the case of the exemplary embodiment described here is formed by two element substrates 110 and 120, which have been processed independently of one another. Both element substrates 110 and 120 include a plurality of similar element functions situated in a grid, which is illustrated in FIGS. 1a through 1f by a string of the corresponding element functions. One element substrate 110 is an ASIC substrate having circuit functions, which are not shown here in detail, and having a layer structure 111, which includes a plurality of wiring levels 112 for the circuit functions and on whose top side a wiring level including contact surfaces 113, 114 for electrical contacting is formed. The other element substrate 120 is a MEMS substrate including a micromechanical sensor structure 121, which is formed in a layer structure on the top side of the substrate. The top side of MEMS substrate 120 has been provided with a structured metallization, in which a bond frame 122 for mechanical connection to ASIC substrate 110 and electrical contract areas 123 for implementation of an electrical connection between the MEMS function and ASIC substrate 110 is formed. The circuit functions of ASIC substrate 110 are advantageously used for analysis of the sensor signals, which are detected with the aid of sensor structure 121 of MEMS substrate 120. FIG. 1a shows two element substrates 110 and 120 prior to the connection to form a wafer stack.

Figure 1B:
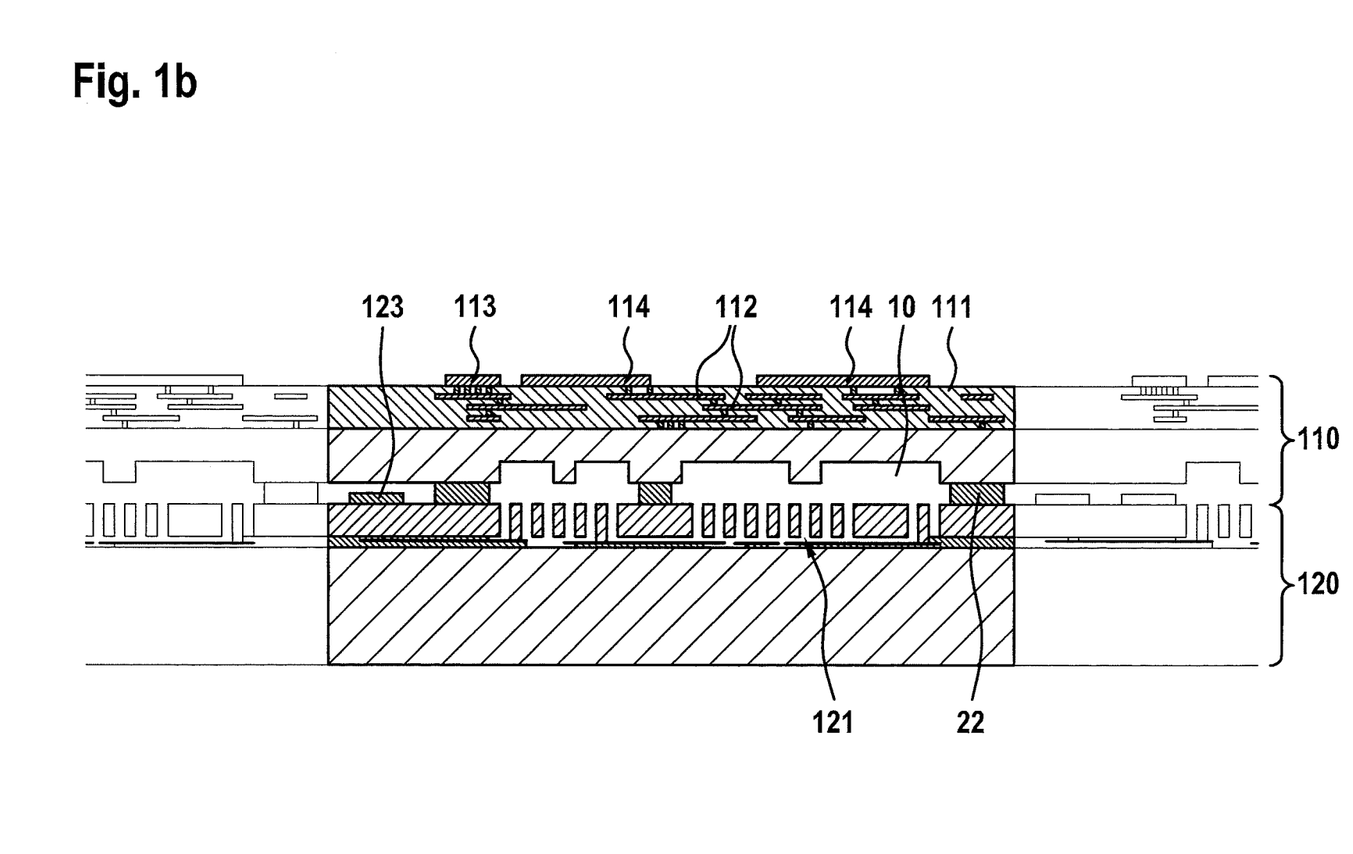

Since ASIC substrate 110 in the exemplary embodiment described here is also to be used as a cap for sensor structure 121 of MEMS substrate 120, it was first thinned on the rear side to minimize the overall height of the wafer stack. ASIC substrate 110 was then structured on the rear side to create recesses 10 in the area over sensor structure 121. Only then were both element substrates 110 and 120 joined together in a bonding operation. A hermetically sealed connection 22 between the rear side of ASIC substrate 110 and the top side of MEMS substrate 120 was then established in the area of the bond frame, so that sensor structure 121 is sealed against external interfering influences by structured ASIC substrate 110, as illustrated in FIG. 1b.

Figure 1C:
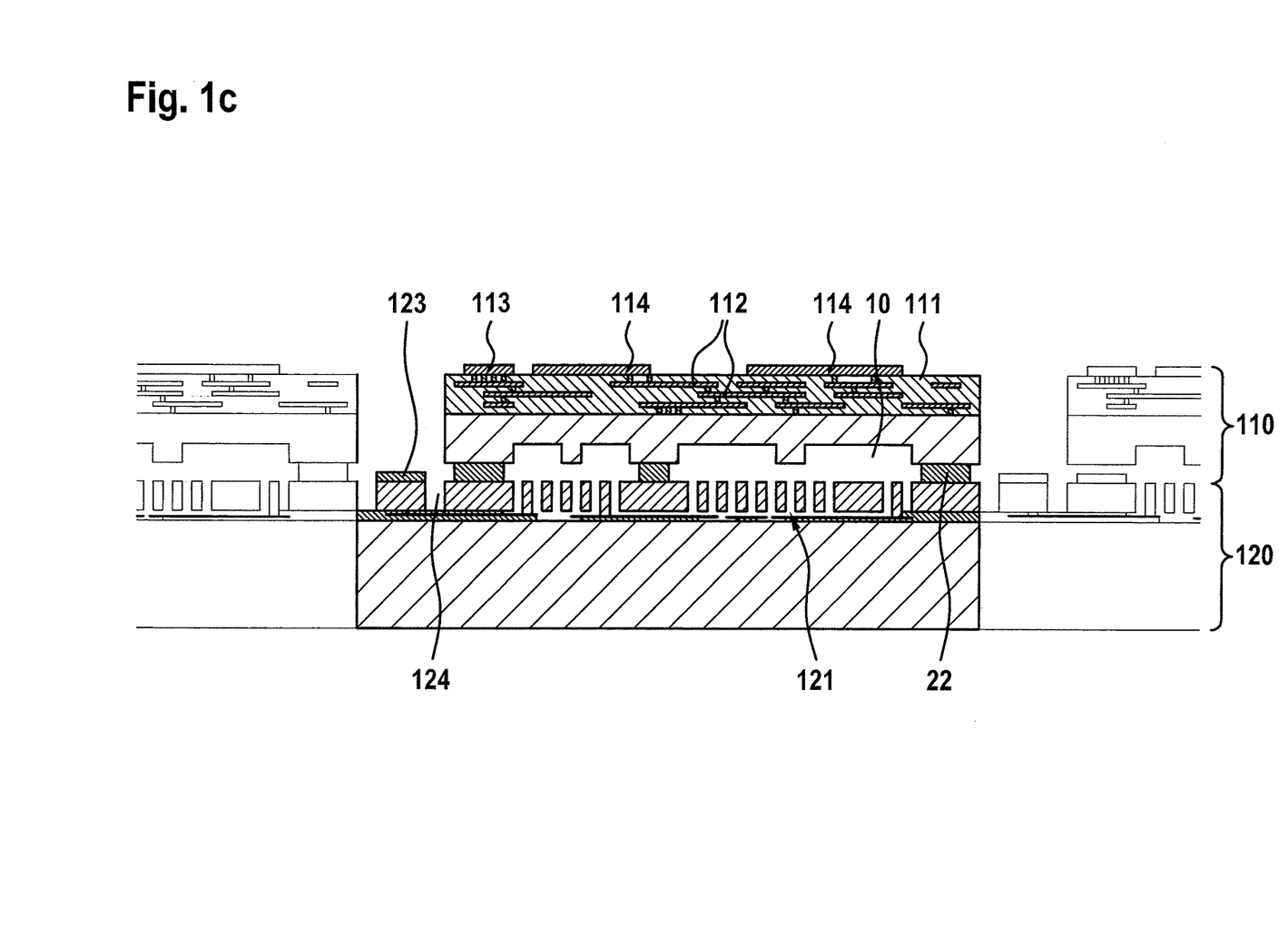

The electrical connections between ASIC substrate 110 and the MEMS substrate are established only after this assembly step in the exemplary embodiment described here, namely in the form of wire bonds, which connect contact surfaces 113 on ASIC substrate 110 to corresponding contact areas 123 on MEMS substrate 120. In a first step, ASIC substrate 110 including layer structure 111 is opened for this purpose above these contact areas 123 of MEMS substrate 120 by initially removing the layer structure here and then also removing the substrate material. This may take place in a trench process, for example. FIG. 1c shows the wafer stack structured in this way after another structuring step, in which isolation trenches 124 were created in the layer structure of MEMS substrate 120. Therefore, contact area 123, which is electrically connected to sensor structure 121, was electrically decoupled from the remaining layer structure of MEMS substrate 120. Only then are wire bonds 23 put in place for internal electrical contacting of element substrates 110 and 120.

Figure 1D:
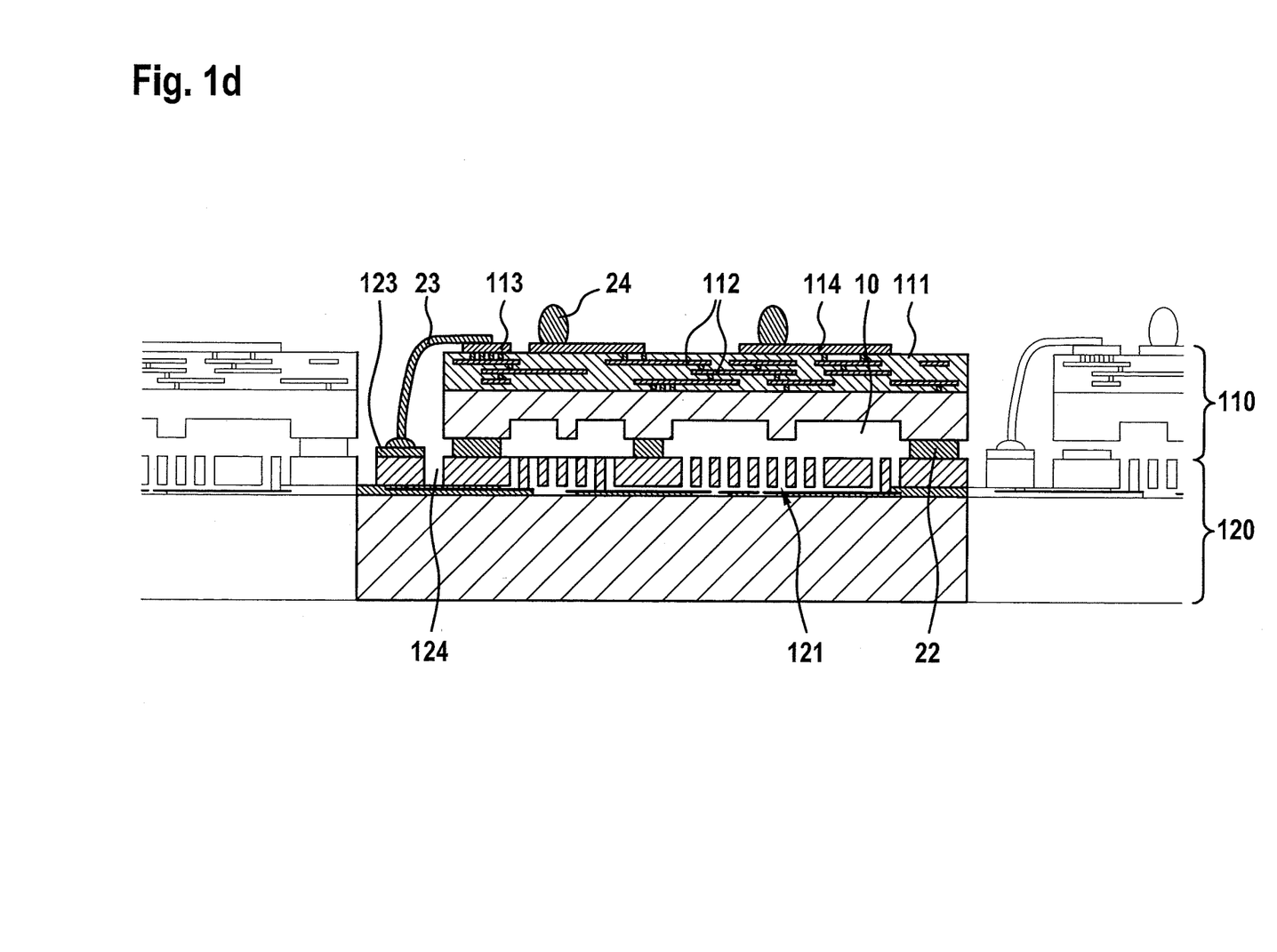

FIG. 1d shows the wafer stack including wire bonds 23 after contact stamp 24 has been placed on contact surfaces 114 of ASIC substrate 110 for external electrical contacting. These may be Au contact stamps, for example, which have been put in place using a wire bond machine, or Ag or Au stamps applied by an inkjet method and sintered. FIG. 1d illustrates that contact stamps 24 project above wire bonds 23.

Figure 1E:
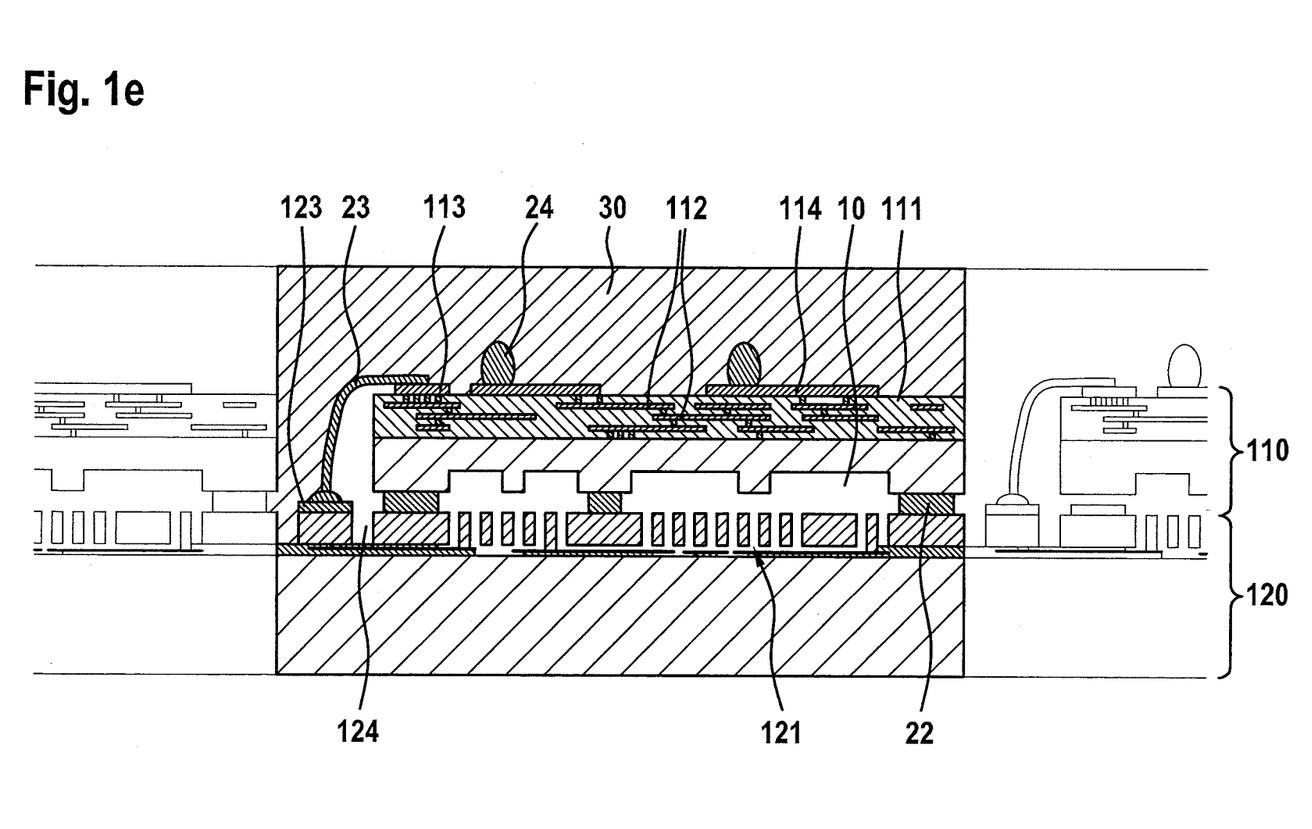

This wafer level structure is provided with a sealing layer 30 of an electrically insulating casting compound in another process step, as illustrated in FIG. 1e. Wire bonds 23 as well as contact stamps 24 are completely embedded in sealing layer 30.

To expose the upper end of contact stamps 24, sealing layer 30 was ground back to the level of contact stamps 24. Wire bonds 23 were not thereby exposed since they are situated at a lower level. The external electrical component connection is established here with the aid of solder balls 25, which are placed directly on contact stamps 24 even before the components are separated. Only thereafter are components 100 separated from the wafer composite, as indicated by the dashed component borders 101 in FIG. 1f.

Figure 1F:
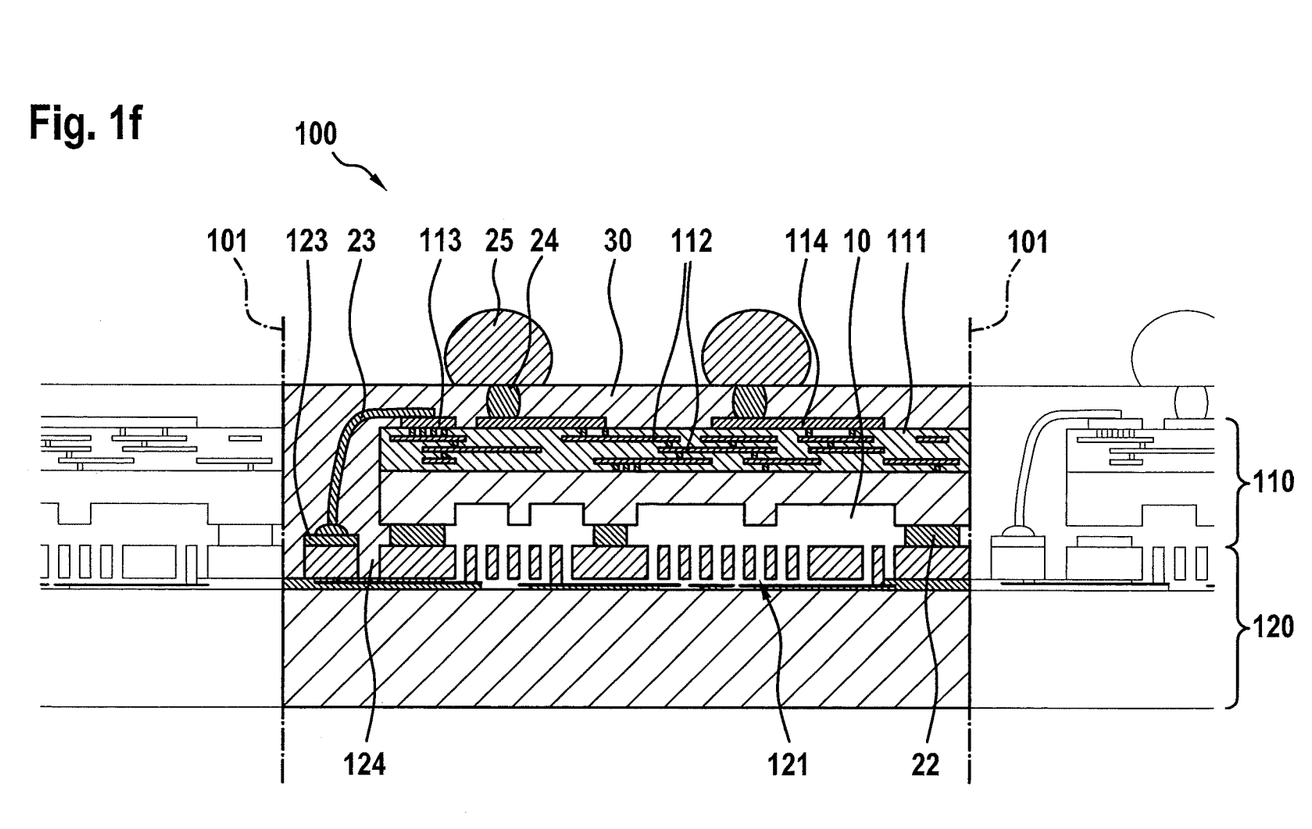

The result of this manufacturing method is a vertically integrated hybrid sensor component 100 in the form of a wafer level package, which is electrically contactable via contact stamps 24 in the upper sealing layer 30.

Figure 2:
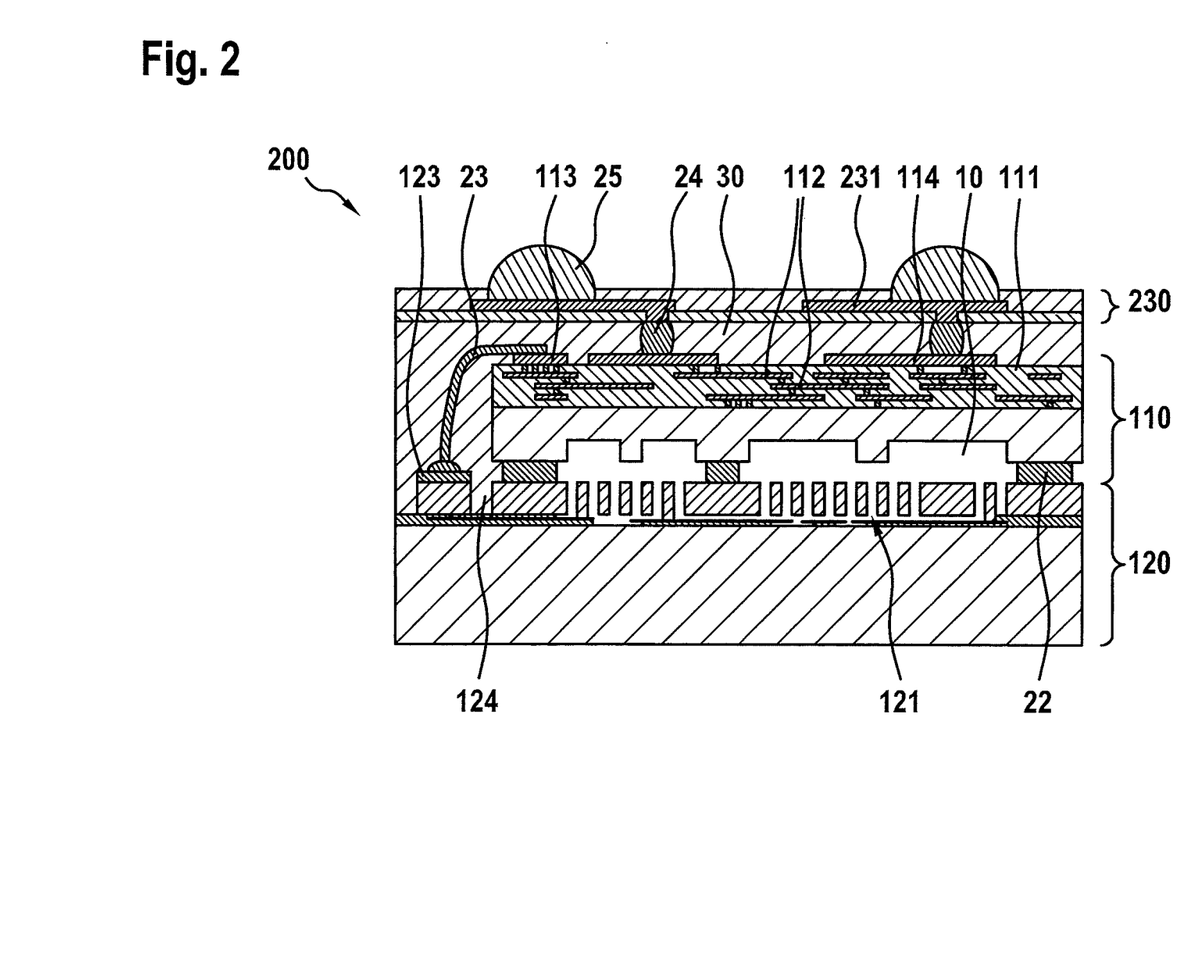
FIG. 2 shows a schematic sectional diagram of a component 200 including a rewiring level for external electrical contacting.

To improve the mechanical and electrical contact between solder balls 25 and contact stamps 24 in sealing layer 30, an adhesive layer may also be applied initially to sealing layer 30. Alternatively or additionally, sealing layer 30 may also be provided with a wiring level, in which terminal pads for external electrical contacting are formed. FIG. 2 shows a component variant, in which such a wiring level, including terminal pads 231, is implemented in a layer structure 230 on sealing layer 30. Reference is made to the preceding description to illustrate the other component parts since the structure of component 200 shown here otherwise corresponds to that of component 100 shown in FIG. 1f.

Figure 3:
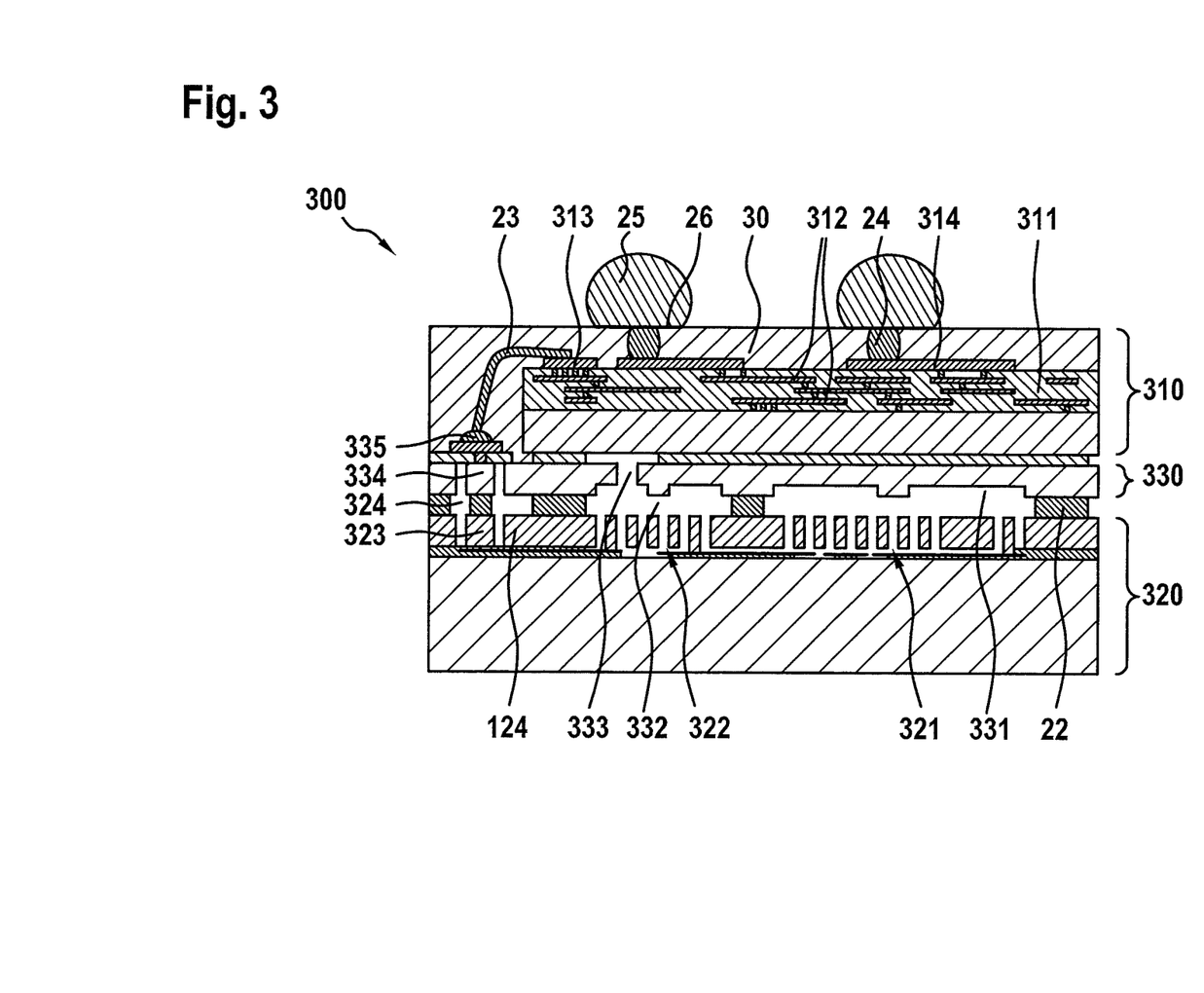
FIG. 3 shows a schematic sectional diagram of a component 300 according to the present invention including three element substrates.

Component 300 shown in FIG. 3 is a wafer level package including three element substrates, a MEMS substrate 320, a cap substrate 330 for the MEMS substrate and an ASIC substrate 310 assembled on the cap substrate. This structure also allows the use of very thin ASIC substrates.

Two micromechanical sensor structures 321, 322 are formed on MEMS substrate 320 in a layer structure. These are electrically connected to a contact area 323 of the layer structure, which is electrically decoupled from the remaining layer structure of MEMS substrate 320 by isolation trenches 324.

Cap substrate 330 was bonded at its structured rear side to the top side of MEMS substrate 320, so that sensor structure 321 is enclosed with a hermetic seal in a cavern 331 between cap substrate 330 and MEMS substrate 320. A cavern 332 is also formed in cap substrate 330 in the area above other sensor structure 322 of MEMS substrate 320, although this cavern is hermetically sealed only by assembly of ASIC substrate 310 on cap substrate 330 since cap substrate 330 has a through-opening 333 in this area. Depending on the process conditions during assembly of cap substrate 330 and ASIC substrate 310, different pressure conditions may be established in caverns 331 and 332 to operate two sensor structures 321 and 322 at a different pressure. At any rate, both sensor structures 321, 322 are protected against external interfering influences by the wafer level package structure.

A via 334 in cap substrate 330 is formed above contact area 323 of MEMS substrate 320 including a terminal pad 335 on the top side of cap substrate 330. The electrical connection between MEMS substrate 320 and cap substrate 330 is established via bond connection 22 between contact area 323 and via 334.

Evaluation circuits for micromechanical sensor functions 321, 322 of MEMS substrate 320 are implemented in ASIC substrate 310. A layer structure 311 on the top side of ASIC substrate 310 includes several wiring levels 312 for the evaluation circuits. A wiring level including contact surfaces 313, 314 for internal and external electrical contacting is situated on layer structure 311. ASIC substrate 310 is opened in the area above via 334 of cap substrate 330.

The electrical connection between ASIC substrate 310 and MEMS substrate 320 is established here with the aid of via 334 of the cap wafer, namely with the aid of a wire bond 23, which connects contact surfaces 313 on ASIC substrate 310 to terminal pad 335 of via 334—as in the case of component 100.

It should be pointed out here that the electrical connection between the ASIC substrate and the MEMS substrate in this component structure could also be established directly via a wire bond between a contact area of the MEMS substrate and a contact surface on the top side of the ASIC substrate. For this purpose, the cap substrate as well as the ASIC substrate would have to be opened above the contact area of the MEMS substrate.

The external contacting of component 300 takes place according to the present invention via contact stamps 24, which have been placed on contact surfaces 314 of ASIC substrate 310, so that they project above wire bond 23. These contact stamps 24 are embedded together with wire bond 23 in a sealing layer 30, which is made of an electrically insulating casting compound and has been applied to the wafer stack in a molding method. The upper end of contact stamps 24 is exposed in the surface of sealing layer 30, so that contact stamps 24—and thus also ASIC substrate 310 and MEMS substrate 320—may be electrically contacted by way of an adhesive layer 26 and solder balls 25.

In the component structure described above, it has proven advantageous when the MEMS sensor structures are at the same electrical potential as the cap substrate. Therefore, a conductive connecting material is preferably used between the MEMS substrate and the cap substrate, such as AlGe, to apply the bond frame to a defined potential with the aid of suitable wiring. Alternatively, the cap wafer may also be applied to a defined electrical potential via the ASIC substrate.

Figure 4:
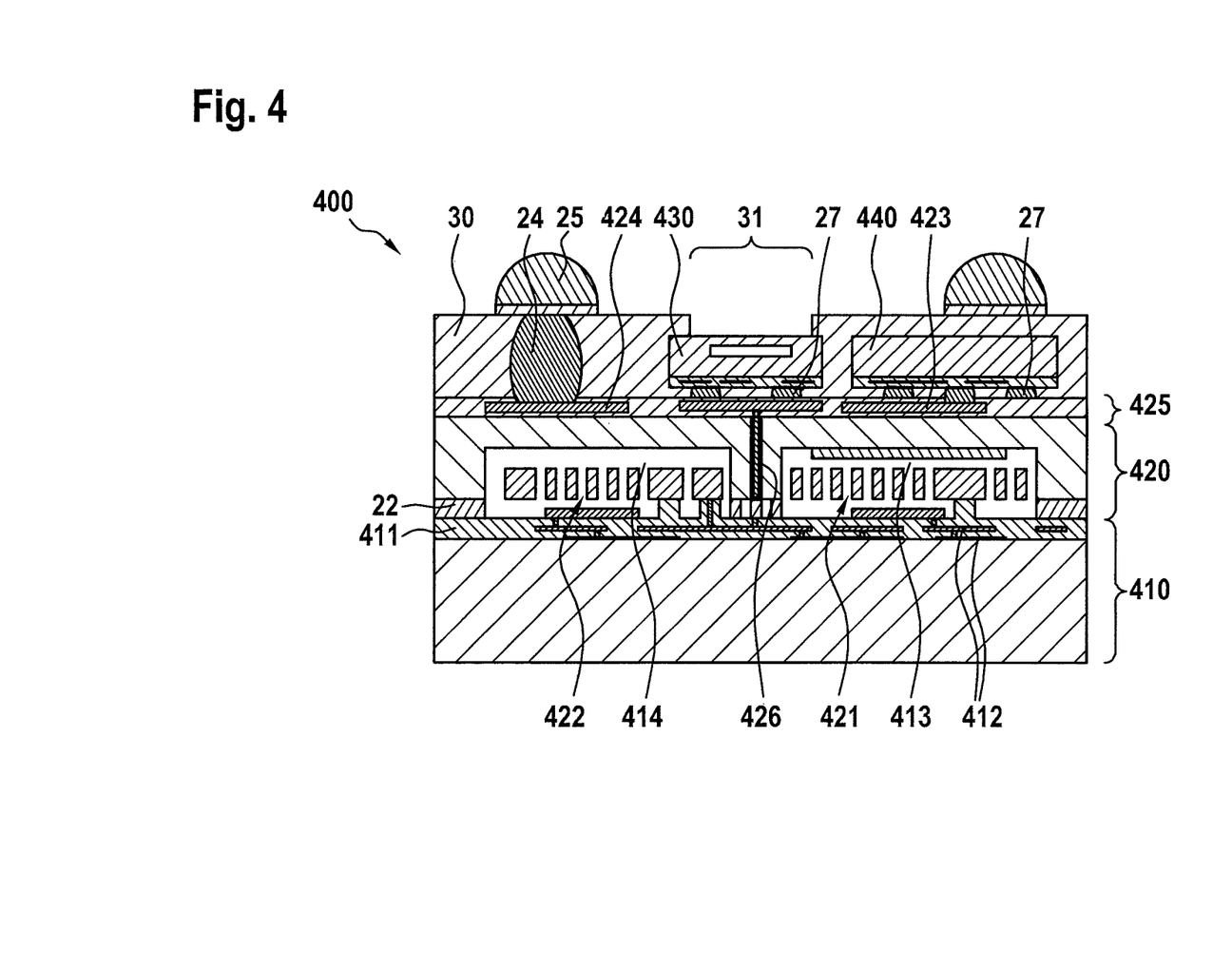
FIG. 4 shows a schematic sectional diagram of a component 400 according to the present invention, whose structure also includes individual chips in addition to a wafer level package.

The structure of component 400 illustrated in FIG. 4 includes two individual chips 430 and 440 including additional micromechanical and circuitry-wise functionalities to supplement the component function in addition to a wafer level package made up of an ASIC substrate 410 and a MEMS substrate 420. The exemplary embodiment shown here is a micromechanical sensor chip 430 and a logic chip 440 in the case of the individual chips. The chip surfaces of these individual chips are much smaller than those of both element substrates 410 and 420.

Evaluation circuits for micromechanical sensor functions 421, 422 of MEMS substrate 420 are implemented in ASIC substrate 410. A layer structure 411 on the top side of ASIC substrate 410 includes several wiring levels 412 for the evaluation circuits.

MEMS substrate 420 was assembled face down, i.e., with its active front side on layer structure 411 of ASIC substrate 410, so that the sensor structures 421, 422 are enclosed in sealed caverns 413, 414 between MEMS substrate 420 and ASIC substrate 410. A bonding method was used for the assembly, in which a hermetically sealed mechanical connection 22 between two element substrates 410 and 420 was established as well as electrical connections 22 between micromechanical sensor structures 421, 422 and wiring levels 412 of ASIC substrate 410. A layer structure 425 including a wiring level, in which contact surfaces 423, 424 for internal and external contacting of component 400 are formed, is situated on the rear side of MEMS substrate 420.

The electrical connection between sensor structures 421, 422 on one side of MEMS substrate 420 and layer structure 425 on the other side of MEMS substrate 420 is established here with the aid of a via 426 in MEMS substrate 420, which is also electrically connected to wiring levels 412 of ASIC substrate 410.

Individual chips 430 and 440 are assembled on rear-side layer structure 425 of MEMS substrate 420. The electrical connection to the other component parts is established with the aid of solder balls 27 on contact surfaces 423.

The external contacting of component 400 takes place according to the present invention via contact stamps 24, which have been placed on contact surfaces 424 of MEMS substrate 420, so that they project above individual chips 430 and 440. These contact stamps 24 are embedded together with individual chips 430 and 440 in a sealing layer 30 made up of an electrically insulating casting compound and applied to the wafer stack in a molding method. The upper end of contact stamps 24 is exposed in the surface of sealing layer 30 so that contact stamps 24 and thus also all parts of component 400 may be electrically contacted. Furthermore, a pressure terminal opening 31 is formed in sealing layer 30 above sensor chip 430.

The structure concept described in conjunction with FIG. 4 provides for a combination of individual chips and element substrates in the form of a wafer level package. It thus permits implementation of components having a different scope of functions for different applications on the basis of a single type of wafer level package. Furthermore, functions of element substrates may be shifted from the wafer level package to individual chips to improve the area matching of the element substrates and to minimize the chip area of the component.

What is claimed is:

1. A component in the form of a wafer level package, comprising:
    at least two element substrates wire-bonded one above the other;
    a molded upper sealing layer of an electrically insulating casting compound; and
    at least one contact stamp via which an external electrical contacting of the component on a top side of the component is implemented, the at least one contact stamp being embedded in the molded upper sealing layer such that (i) a lower end of the at least one contact stamp is connected to a wiring level of one of the element substrates and (ii) an upper end of the at least one contact stamp is exposed on a surface of the molded upper sealing layer,
    wherein at least one multi-level rewiring for the at least one contact stamp is provided on the molded upper sealing layer,
    wherein the at least one contact stamp is connected to a wiring level on the molded upper sealing layer, and wherein at least one terminal pad is formed in the multi-level rewiring on the molded upper sealing layer for an external electrical connection of the component,
    wherein at least one individual chip is assembled in the wafer level package, and wherein the at least one individual chip is at least partially embedded in the electrically insulating casting compound of the molded upper sealing layer and is electronically connected to sensor circuitry of one of the element substrates by a via therethrough.

2. The component as recited in claim 1, wherein the at least one contact stamp contains at least one of Al, Cu, Au and Ag.

3. The component as recited in claim 1, wherein at least one electrical connection in the form of a wire bond connection is implemented between active element front sides of the two element substrates, and wherein the wire bond connection is completely embedded in the molded upper sealing layer.

* * * * *